United States Patent [19]

Okamoto et al.

[11] 4,369,381

[45] Jan. 18, 1983

[54] CMOS SCHMITT-TRIGGER CIRCUIT

[75] Inventors: Keizo Okamoto, Sagamihara; Masayoshi Tomita, Kawasaki; Osamu Takagi, Tokyo, all of Japan

[73] Assignee: Fujitsu Limited, Kawasaki, Japan

[21] Appl. No.: 168,356

[22] Filed: Jul. 11, 1980

[30] Foreign Application Priority Data

Jul. 19, 1979 [JP] Japan .................. 54-91969

[51] Int. Cl.[3] ................... H03K 3/356; H03K 3/037
[52] U.S. Cl. ................... 307/279; 307/290
[58] Field of Search .......... 307/220 C, 221 C, 224 C, 307/225 C, 279, 288, 290, 451, 453, 452, 481

[56] References Cited

U.S. PATENT DOCUMENTS

| | | | |
|---|---|---|---|
| 3,835,336 | 9/1974 | Block | 307/451 X |
| 3,855,549 | 12/1974 | Huener et al. | 307/451 X |
| 3,873,856 | 3/1975 | Gerlach et al. | 307/279 |
| 3,882,331 | 5/1975 | Sasaki | 307/279 |
| 3,984,703 | 10/1976 | Jorgensen | 307/290 X |
| 4,025,800 | 5/1977 | Wanlass | 307/451 X |

FOREIGN PATENT DOCUMENTS 55-39413  3/1980  Japan .................. 307/290

*Primary Examiner*—Larry N. Anagnos
*Attorney, Agent, or Firm*—Staas & Halsey

[57] ABSTRACT

A CMOS Schmitt-trigger circuit for shaping the wave form of an input signal to be applied to logic circuits, such as flip-flops, counters, etc. The CMOS Schmitt-trigger circuit has an input terminal connected to a signal source, and comprises a first CMOS inverter, a second CMOS inverter connected in cascade to the first CMOS inverter, a third CMOS inverter connected in cascade to the second CMOS inverter, and a feedback resistance connected between the output end of the third CMOS inverter and the input end of the second CMOS inverter. The schmitt width of the CMOS Schmitt inverter according to the present invention has less dependency on the impedance of the input signal source than the prior-art devices do.

14 Claims, 11 Drawing Figures

CMOS SCHMITT-TRIGGER CIRCUIT

BACKGROUND OF THE INVENTION

This invention relates to a schmitt-trigger circuit constructed by CMOS (Complementary Metal Oxide Semiconductor) inverters connected in cascade.

DESCRIPTION OF THE PRIOR ART

Various logic circuits, such as flip-flops, shift registers, counters, etc., start their operations when the potential voltages of clock signals at their clock input rise or fall. However, if the wave form of a clock signal applied to the clock input of a logic circuit is distorted so that the rising time or falling time of the clock signal is prolongated, this often causes an operation error of the logic circuit. In order to avoid the operation error, the clock signal is usually converted so that its wave form has a characteristic of rapid rising time or rapid falling time. Such a characteristic can be obtained by using the well known schmitt-trigger circuit as a waveform shaping circuit. It is often required also in a logic circuit that stable operation be maintained even when the voltage level of the input signal fluctuates within a predetermined margin. The schmitt-trigger circuit is also used for increasing the allowable margin of fluctuation of the input-signal level. The known schmitt-trigger circuit is essentially comprised of two inverters connected in series and a feedback resistor connected to these inverters in parallel. The schmitt-trigger circuit is characterised by a parameter called the schmitt width, which is determined by the difference between an upper threshold voltage and a lower threshold voltage, as hereinafter described in detail. It is important that the schmitt width be independent from the impedance of the input-signal source. However, in the known schmitt-trigger circuit, the schmitt width is significantly dependent on the input-signal impedance. In addition, since the schmitt width in the known schmitt-trigger circuit also depends significantly on the power supply voltage of the known schmitt-trigger circuit, the circuit is not suitable for the case when the schmitt width is required not to depend on the power supply voltage.

SUMMARY OF THE INVENTION

Therefore, an object of the present invention is to provide a schmitt-trigger circuit having a schmitt width which is independent from the input-signal impedance.

It is another object of the present invention to provide a schmitt-trigger circuit having a schmitt width which is independent from the power supply voltage.

It is still another object of the present invention to provide a schmitt-trigger circuit having a schmitt width which is independent from the input-signal impedance but dependent on the power supply voltage.

BRIEF DESCRIPTION OF THE DRAWINGS

The above mentioned and other objects and advantages of the present invention will be readily apparent from the following description with reference to the accompanying drawings, in which like reference characters designate the same or similar parts throughout the figures thereof and wherein:

FIG. 1b is a graph illustrating the input-output characteristic of the circuit of FIG. 1a;

FIG. 2b is an equivalent circuit diagram of the schmitt-trigger circuit of FIG. 2a;

FIG. 2c is a graph of the input-output characteristic of the circuit of FIG. 2a;

DESCRIPTION OF THE PREFERRED EMBODIMENTS

Before describing the preferred embodiments, an inverter and a prior-art schmitt-trigger circuit will first be explained with reference to FIGS. 1a, 1b, 2a, 2b and 2c.

Figure 1A:
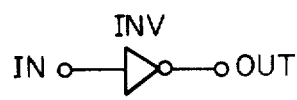
FIG. 1a is a circuit diagram of an inverter as a simple wave-shaping circuit.
Figure 1B:
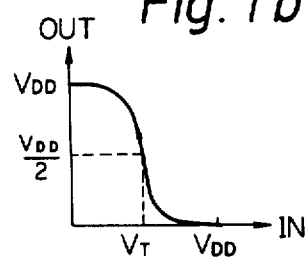

FIG. 1a is a circuit diagram of an inverter INV. As is well known, the voltage level at the input IN is inverted through the inverter at the output OUT. FIG. 1b shows an input-output characteristic of this inverter INV. As shown in FIG. 1b, the output voltage level is high or low, depending on the low or high level of the input voltage respectively. When the inverter INV is constructed by a CMOS device, the CMOS device is often designed to have a threshold voltage $V_T$ of $V_{DD}/2$ for turning on or off, where $V_{DD}$ represents the power supply voltage applied across the CMOS. The threshold voltage of $V_{DD}/2$ is preferable for the purpose of increasing the margin of the input voltage. In the following description, it is assumed that the threshold voltage of a CMOS inverter is $V_{DD}/2$. As will be seen in FIG. 1b, a single inverter has no hysteresis curve with respect to the input and output voltages. Therefore, the output voltage is turned from a high level to a low level or vice versa when the input voltage reaches the threshold voltage $V_T$ during the rising or falling of the input voltage respectively.

Figure 2A:
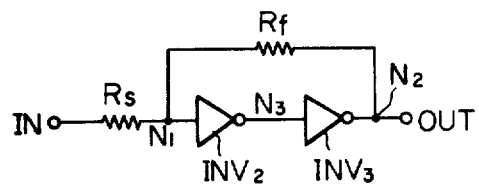
FIG. 2a is a circuit diagram of a schmitt-trigger circuit of the prior art.

A schmitt-trigger circuit of the prior art is illustrated in FIG. 2a, in which the schmitt-trigger circuit is comprised of two CMOS inverters $INV_2$ and $INV_3$ connected in series, and a feedback resistance Rf connected in parallel to the two CMOS inverters $INV_2$ and $INV_3$. There is an input resistance Rs between the connecting point $N_1$ and the input terminal IN of the schmitt-trigger circuit, where the connecting point $N_1$ connects the input resistance Rs and the input end of the inverter $INV_1$. The input resistance Rs includes the output impedance of a signal source (not shown) connected to the input terminal IN. Since the inverters $INV_2$ and $INV_3$ are connected in series, the voltage phase at the connecting point $N_1$ of the inverter $INV_2$ is equal to that at a connecting point $N_2$ between the output end of the inverter $INV_2$ and the output terminal OUT. When the voltages at the connecting points $N_1$ and $N_2$ are both zero, the voltage at the connecting point $N_3$ between the inverters $INV_2$ and $INV_3$ is equal to the power supply voltage $V_{DD}$. On the contrary, when the voltages at the connecting points $N_1$ and $N_2$ are both $V_{DD}$, the voltage at the connecting point $N_2$ is equal to zero.

Figure 2B:
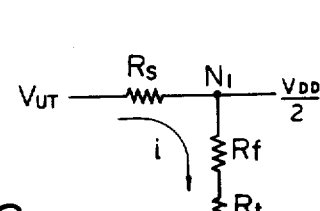

FIG. 2b is an equivalent circuit diagram of the schmitt-trigger circuit of FIG. 2a, approximated by passive elements. Since the input resistance of the inverter $INV_2$ or $INV_3$ can be regarded as infinite, and since the output resistance of the inverter $INV_3$ is equal to the resistance Rt equivalent to the resistance of the p-channel or n-channel FET in the output side of the CMOS inverter $INV_3$, the equivalent circuit is comprised of the input resistance Rs, the feedback resistance $R_f$ and the equivalent resistance $R_t$ connected in series.

Figure 2C:
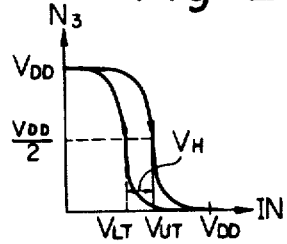

In operation, when the input voltage reaches a value $V_{UT}$ (during the increasing of the input voltage from zero volts to $V_{DD}$,) the voltage at the connecting point $N_1$ of the inverter $INV_2$ reaches $V_{DD}/2$, so that the voltage level at the output of the inverter $INV_2$ changes from $V_{DD}$ to zero volts, and then the voltage level at the output of the inverter $INV_3$ changes from zero volts to $V_{DD}$. In FIG. 2c, the change of the voltage at the connecting point $N_3$ is illustrated with respect to the input voltage. The voltage $V_{UT}$ is referred to as an upper threshold voltage. If it is assumed that the current flowing through the input resistor $R_s$ is i, the following equation is obtained.

$$V_{UT} - \frac{V_{DD}}{2} = i \cdot R_s \quad (1)$$

The equivalent resistance $R_t$ can be neglected because the feedback resistance $R_f$ is much greater than the equivalent resistance $R_t$. Therefore, the following equation is also obtained.

$$\frac{V_{DD}}{2} = i \cdot R_f \quad (2)$$

From the above two equations, the upper threshold voltage $V_{UT}$ can be expressed as:

$$V_{UT} = \frac{V_{DD}}{2} \cdot \frac{R_f + R_s}{R_f} \quad (3)$$

On the contrary, when the input voltage reaches a value $V_{LT}$ during the decreasing of the input voltage from $V_{DD}$ to zero volts, the voltage at the input end $N_1$ of the inverter $INV_2$ reaches $V_{DD}/2$, so that the voltage level at the output of the inverter $INV_2$ is turned from zero volts to $V_{DD}$, and then, the voltage level at the output of the inverter $INV_3$ is turned from $V_{DD}$ to zero volts. The voltage $V_{LT}$ is referred to as a lower threshold voltage. In this case, since the output voltage is higher than the input voltage, current i flows from the output terminal OUT to the input terminal IN. Therefore, the following equation is obtained.

$$\frac{V_{DD}}{2} - V_{LT} = i \cdot R_s \quad (4)$$

From the equations (2) and (4), the lower threshold voltage can be expressed as:

$$V_{LT} = \frac{V_{DD}}{2} \cdot \frac{R_f - R_s}{R_f} \quad (5)$$

Consequently, the upper threshold voltage $V_{UT}$ differs from the lower threshold voltage $V_{LT}$. Therefore, the CMOS inverter in the schmitt-trigger circuit of FIG. 2a has a hysteresis curve with respect to the input and output voltages of the inverter. FIG. 2c illustrates a hysteresis curve of the inverter $INV_2$. In FIG. 2c, the difference between the upper threshold voltage and the lower threshold voltage is referred to as a schmitt width $V_H$. From the above equations (3) and (4), the schmitt width $V_H$ can be expressed as:

$$V_H = V_{UT} - V_{LT} = \frac{R_s}{R_f} \times \frac{V_{DD}}{2} \quad (6)$$

As will be understood from the equation (6), according to the prior-art schmitt-trigger circuit, the schmitt width $V_H$ depends on the input resistance $R_s$. As previously mentioned, the input resistance $R_s$ includes the impedance of the input-signal source. Therefore, there exists a disadvantage in the prior-art schmitt-trigger circuit in that the schmitt width $V_H$ is dependent on the impedance of the input-signal source. In addition, if it is desired that the schmitt width $V_H$ be kept constant without dependency on the power supply voltage $V_{DD}$, the prior-art schmitt-trigger circuit is not suitable for this case, because, as can be seen from the equation (6), the schmitt width $V_H$ is significantly dependent on the power supply voltage.

According to the present invention, there is provided a schmitt-trigger circuit which has a schmitt width independent of the impedance of the input-signal source. According to the first embodiment of the invention, the schmitt width is independent of the power supply voltage. According to the second embodiment, the schmitt width is dependent on the power supply voltage. The preferred embodiments of the present invention will now be described in detail in conjunction with FIGS. 3 through 8.

Figure 3:
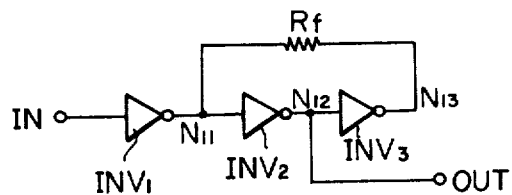
FIG. 3 is a circuit diagram of a schmitt-trigger circuit according to one embodiment of the present invention.

FIG. 3 is a circuit diagram of a schmitt-trigger circuit according to one embodiment of the present invention, in which the schmitt-trigger circuit is comprised of three CMOS inverters $INV_1$ through $INV_3$ connected in cascade, and a feedback resistance Rf is connected between a connecting point $N_{13}$ (connected to the output end of the inverter $INV_3$) and the connecting point $N_{11}$ between the inverters $INV_1$ and $INV_2$. The input terminal IN is connected to the inverter $INV_1$, and the output terminal OUT is connected to the connecting point $N_{12}$ between the inverters $INV_2$ and $INV_3$. By this construction, the phase of the output voltage at the output terminal OUT is the same as that of the input voltage at the input terminal IN.

Figure 4:
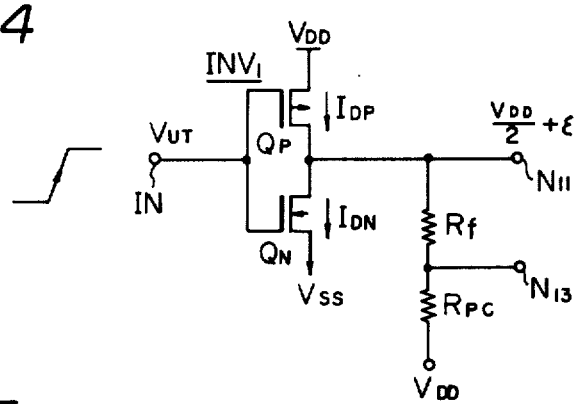
FIG. 4 is a circuit diagram equivalent to the main part of the circuit of FIG. 3.

FIG. 4 is an approximated equivalent circuit diagram of the schmitt-trigger circuit of FIG. 3. In FIG. 4, the inverter $INV_1$ is comprised of a p-channel MOS transistor $Q_P$ and the n-channel MOS transistor $Q_N$. The gates of both MOS transistors are connected together to the input terminal IN. The drain of the MOS transistor $Q_P$ and the drain of the MOS transistor $Q_N$ are connected together to the connecting point $N_{11}$. The inverters $INV_2$ and $INV_3$ both have the same constructions as the inverter $INV_1$. However, in order to avoid complexity, the circuit stage following the inverter $INV_1$ can be expressed by the feedback resistance Rf and a resistance Rpc connected in series, where the resistance Rpc represents the resistance of the p-channel MOS transistor in the inverter INV$_3$ when the p-channel MOS transistor is in an on state.

The operation of the circuit of FIG. 3 will now be described in detail. When the input voltage at the input terminal IN is zero volts, the voltage at the connecting point N$_{11}$ of the inverter INV$_1$ is equal to the power supply voltage V$_{DD}$, the voltage at the connecting point N$_{12}$ of the inverter INV$_2$ is equal to the ground voltage V$_{SS}$ which is equal to zero volts, and the voltage at the connecting point N$_{13}$ of the inverter INV$_3$ is equal to V$_{DD}$. In this condition, when the input voltage at the input terminal IN is increased from zero volts to V$_{DD}$, the voltage at the point N$_{11}$ will then be decreased from V$_{DD}$ toward zero volts. However, in contrast to the prior art, the voltage at the point N$_{11}$ is determined not only by the output voltage of the inverter INV$_1$, but also, by the feedback current flowing through the resistance R$_{pc}$ and the feedback resistance Rf from the point N$_{13}$ to the point N$_{11}$. The effect of the feedback current on the voltage at the point N$_{11}$ is expressed in FIG. 4 by the notation "ϵ". Thus, the voltage at the point N$_{11}$, shortly before turning the state of the inverter INV$_2$ changes is expressed as:

$$\frac{V_{DD}}{2} + \epsilon$$

as shown in FIG. 4. When the input voltage at the input terminal IN is close to the upper threshold voltage V$_{UT}$ during the increasing of the input voltage from zero volts to V$_{DD}$, the P-channel transistor Q$_p$ and the n-channel transistor Q$_N$ in the inverter INV$_1$ are both in a state of saturation. The condition of the p-channel transistor and the n-channel transistor being in the state of saturation is:

$$\left(\frac{V_{DD}}{2} + \epsilon\right) - |V_{TP}| \leq V_{UT} < \left(\frac{V_{DD}}{2} + \epsilon\right) + V_{TN} \quad (7)$$

where V$_{TP}$ and V$_{TN}$ represent the threshold voltages of the p-channel transistor Q$_p$ and the n-channel transistor Q$_N$, respectively. The drain currents I$_{DN}$ and I$_{DP}$ of the p-channel transistor Q$_p$ and the n-channel transistor Q$_N$, respectively, in their saturated states can be expressed as:

$$I_{DN} = \frac{\beta_N}{2}(V_{UT} - V_{TN})^2 \quad (8)$$

$$I_{DP} = \frac{\beta_P}{2}(V_{UT} - V_{DD} - V_{TP})^2 \quad (9)$$

where $\beta_N$ and $\beta_P$ represent the current-amplification factors of the n-channel transistor Q$_N$ and the p-channel transistor Q$_p$, respectively. Also, according to Kirchhoff's law, the relation between the drain currents I$_{DP}$ and I$_{DN}$ can be expressed as:

$$I_{DP} = I_{DN} - \frac{V_{DD}}{2(R_f + R_{PC})} \quad (10)$$

where ϵ is neglected because V$_{DD}$ is much greater than ϵ. For the purpose of simplification, let it be assumed that:

$$\beta_N = \beta_P \text{ and}$$

$$V_{TN} = -V_{TP}$$

Using the above relations as well as the relations (8) and (9), the relation (10) can be expressed as:

$$\frac{\beta_N}{2}(V_{UT} - V_{TN})^2 =$$

$$\frac{\beta_N}{2}(V_{UT} - V_{DD} + V_{TN})^2 - \Gamma \frac{V_{DD}}{2(R_f + R_{pc})}$$

Therefore, the upper threshold voltage V$_{UT}$ can be expressed as:

$$V_{UT} = \frac{V_{DD}}{2\beta_N(V_{DD} - 2V_{TN})} \times \frac{1}{R_f + R_{pc}} + \frac{1}{2}V_{DD} \quad (11)$$

Also, the difference between the upper threshold voltage V$_{UT}$ and the threshold voltage of an inverter can be expressed as:

$$\Delta V_{UT} = V_{UT} - \frac{1}{2}V_{DD} = \quad (12)$$

$$\frac{1}{2\beta_N}\left(1 + \frac{2V_{TN}}{V_{DD} + 2V_{TN}}\right)\frac{1}{R_f + R_{pc}}$$

The lower threshold voltage V$_{LT}$ can also be obtained in a similar manner to that in which the upper threshold voltage has been obtained. The lower threshold voltage V$_{LT}$ can be expressed as:

$$V_{LT} = \frac{V_{DD}}{2\beta_N(V_{DD} - 2V_{TN})} \times \frac{1}{R_f + R_{NC}} + \frac{1}{2}V_{DD} \quad (13)$$

The difference between the voltage V$_{LT}$ and the threshold voltage of an inverter is:

$$\Delta V_{LT} = V_{LT} - \frac{1}{2}V_{DD} = \quad (14)$$

$$-\frac{1}{2\beta_N}\left(1 + \frac{2V_{TN}}{V_{DD} + 2V_{TN}}\right)\frac{1}{R_f + R_{NC}}$$

where R$_{NC}$ represents the resistance of the n-channel transistor (not shown) in the inverter INV$_3$, when the n-channel transistor is in a on state.

Let it be assumed that the resistance R$_{PC}$ is equal to the resistance R$_{NC}$. Then, the schmitt width V$_H$ of the schmitt-trigger circuit of FIG. 3 is:

$$V_H = \Delta V_{UT} - \Delta V_{LT} = \quad (15)$$

$$\frac{1}{\beta_N}\left(1 + \frac{2V_{TN}}{V_{DD} + 2V_{TN}}\right)\frac{1}{R_f + R_{NC}}$$

In the equation (15), $\beta_N$ is independent of the power supply voltage V$_{DD}$, and the term $$\left(1 + \frac{2V_{TN}}{V_{DD} + 2V_{TN}}\right)$$

is not significantly dependent on $V_{DD}$ if $V_{DD}$ is much higher than $V_{TN}$. Also, since the feedback resistance $R_f$ is generally much larger than the resistance $R_{NC}$, the term $$\frac{1}{R_f + R_{NC}}$$

is nearly equal to $1/R_f$, and thus has almost no dependency on $V_{DD}$. Consequently, the schmitt width $V_H$ according to this embodiment has an almost constant value regardless of the value of the power supply voltage $V_{DD}$. In addition, since there is no input resistance Rs in the equation (15), the schmitt width $V_H$ is independent of the impedance of the input-signal source.

Figure 5:
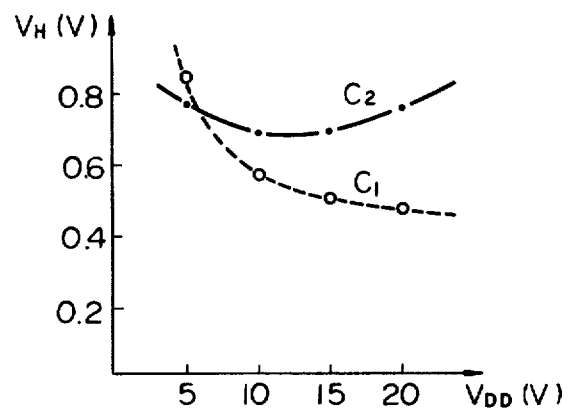
FIG. 5 is a graph showing experimental and theoretical plots of the dependency of the schmitt width on the power supply voltage in the circuit of FIG. 3.

FIG. 5 is composed of two graphs, one being experimental and another being theoretical, showing to the dependency of the schmitt width on the power supply voltage in the circuit of FIG. 3. In FIG. 5, the dotted curve $C_1$ is the theoretical graph and the solid curve $C_2$ is the experimental graph. In both cases, these curves are obtained under the conditions: $\beta_N=65$ $\mu v/V$, $V_{TN}=1.25$ V, $R_f=23$ k$\Omega$, and $R_{NC}(V_{DD}=5$ V$)=2$ k$\Omega$. As can be seen from the experimental curve $C_2$, the schmitt width $V_H$ varies only within 0.1 volt when the power supply voltage $V_{DD}$ varies from 5 to 20 V. Although the relations between $\beta_N$ and $\beta P$, $V_{TN}$ and $V_{TP}$, and $R_{PC}$ and $R_{NC}$ are assumed as $\beta_N=\beta_P$, $V_{TN}=-V_{TP}$ and $R_{PC}=R_{NC}$, respectively, in this embodiment, these relations are not restricted to those assumed, but may be changed depending on the applied field of the schmitt-trigger circuit.

Figure 6:
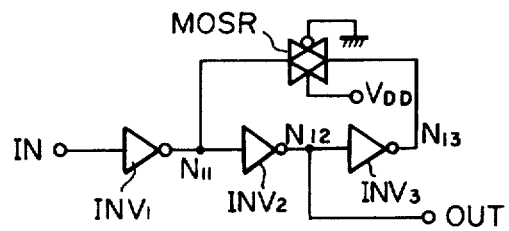
FIG. 6 is a circuit diagram of a schmitt-trigger circuit according to another embodiment of the present invention.
Figure 7:
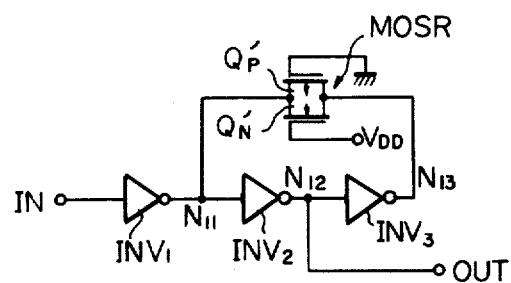
FIG. 7 is an equivalent circuit diagram of the circuit of FIG. 6.

The above-described embodiment is preferably adapted to applications where the dependency of the schmitt width $V_H$ on the power supply voltage $V_{DD}$ is desired to be low. However, there are applications where the schmitt width $V_H$ is desired to vary depending on the variation of the power supply voltage $V_H$, for the purpose of, for example, reducing the influence of power supply noise. FIG. 6 illustrates a schmitt-trigger circuit according to another embodiment of the present invention, in which the schmitt width $V_H$ depends on the power supply voltage $V_{DD}$, as will be apparent from the following description. The difference between the circuits of FIG. 3 and FIG. 6 is that, in place of the feedback resistance Rf in FIG. 3, a resistance element MOSR comprised of two MOS transistors is used in FIG. 6. FIG. 7 is an equivalent circuit diagram of FIG. 6. As illustrated in FIG. 7, the resistance element MOSR is comprised of a p-channel MOS transistor $Q'_p$ and an n-channel MOS transistor $Q'_N$ connected in parallel. The sources of the transistors $Q'_P$ and $Q'_N$ are commonly connected to the connecting point $N_{11}$. The drains of the transistors $Q'_P$ and $Q'_N$ are commonly connected to the output end $N_{13}$ of the inverter INV$_3$. The gate of the transistor $Q'_P$ is grounded. The ground voltage may be negative because the ground voltage is determined by a lower voltage terminal of the power supply. The gate of the transistor $Q'_N$ is connected to the power supply voltage $V_{DD}$. By this construction, when the power supply voltage $V_{DD}$ varies, the resistance through the MOSR, which corresponds to the feedback resistance $R_f$ in FIG. 3, will accordingly be varied. Therefore, the resistance of the MOSR is a function of the power supply voltage $V_{DD}$. When the voltage $V_{DD}$ increases or decreases, the resistance of the MOSR will decrease or increase respectively. If the resistance of the MOSR is indicated also by the notation $R_f$, the above described equations (7) through (14) are also satisfied in the circuit of FIG. 6. Let it be assumed that the resistance $R'_P$ of the p-channel transistor $Q'_P$ in its on state is equal to the resistance $R'_N$ of the n-channel transistor $Q'_N$ in its on state. Also, in the CMOS inverter INV$_3$, the resistance $R_{pc}$ of the p-channel transistor is assumed to be equal to the resistance $R_{NC}$ of the n-channel transistor. Then, the following equation (16) similar to the equation (15) is satisfied in this second embodiment.

$$V_H = \Delta V_{UT} - \Delta V_{LT} = \qquad (16)$$

$$\frac{1}{\beta_N}\left[1 + \frac{2V_{TN}}{V_{DD} + 2V_{TN}}\right] \cdot \frac{1}{R_f + R_{NC}}$$

Referring to the equation (16), the current amplification factor $\beta_N$ does not depend on the power supply voltage $V_{DD}$. Also, the term $$\left(1 + \frac{2V_{TN}}{V_{DD} + 2V_{TN}}\right)$$

is not greatly dependent on $V_{DD}$, as in the case of the equation (15). However, the term $(R_f + R_{NC})$ in the equation (16) is dependent on the power supply voltage $V_{DD}$, because the resistances Rf and $R_{NC}$ are both resistances of MOS transistors in their on states. Therefore, the term $(R_f + R_{NC})$ is inversely proportional to the power supply voltage $V_{DD}$. Consequently, in the schmitt-trigger circuit of FIG. 6, the schmitt width $V_H$ is not dependent on the impedance of the input signal source, but varies in proportion to the power supply voltage $V_{DD}$.

Figure 8:
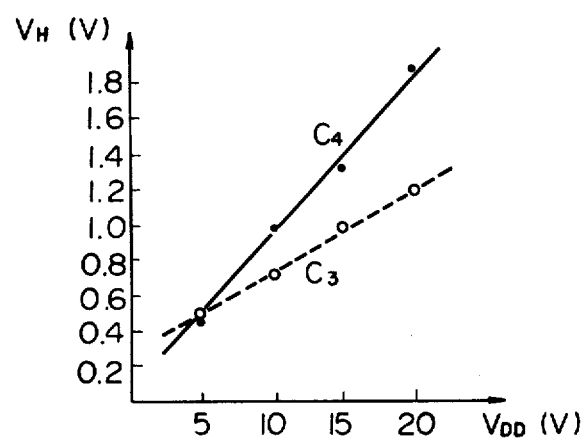
FIG. 8 is a graph showing experimental and theoretical plots of the dependency of schmitt width on the power supply voltage in the circuit of FIG. 6.

FIG. 8 is composed of two graphs, one being experimental and another being theoretical, of the dependency of the schmitt width on the power supply voltage in the circuit of FIG. 6. In FIG. 8, the dotted curve $C_3$ is the theoretical graph and the solid curve $C_4$ is the experimental graph. In both cases these curves are obtained under the conditions: $V_{TN}=1.25$ V, $\beta_N=65$ $\mu v/V$, $R_{NC}(V_{DD}=5$ V$)=2$ k$\Omega$, and $Rf(V_{DD}=5$ V$)=40$ k$\Omega$. As can be seen from FIG. 8, the schmitt width $V_H$ increases proportionately along with the increase of the power supply voltage $V_{DD}$. It is useful for a CMOS, which is to be used in a wide range of power supply voltages, that the schmitt width $V_H$ increases proportionately to the increase in the power supply voltage $V_{DD}$. For example, when a high power supply voltage $V_{DD}$ is applied to a logic circuit connected to the schmitt-trigger circuit, the time required for the rising or falling of the potential voltage of the clock signal is prolongated, so that the possibility of an error operation in the logic circuit is increased. In order to avoid error a wide schmitt width is required. Therefore, the schmitt-trigger circuit of FIG. 6 is suitable for this case. In addition, in order to increase the margin of tolerance to input noise in the logic circuit, a high power-supply voltage maybe applied to the logic circuit. In this case, the schmitt-trigger circuit of FIG. 6, which has a wide schmitt width when the power supply voltage $V_{DD}$ is high, is suitable.

From the foregoing description, it will be understood that the schmitt-trigger circuit according to the present invention has a schmitt-width independent from the impedance of the input signal source. Therefore, the schmitt-trigger circuit is suitable for a wave-form shaping circuit for driving logic circuits such as flip-flops, counters, etc.

It should be noted that the feedback resistance $R_f$ can be integrated within a CMOS IC because, in the first embodiment, the resistance $R_f$ is made by diffusing impurities into the substrate of the CMOS IC and, in the second embodiment, the resistance $R_f$ is made by the MOS resistance itself.

What is claimed is:

1. A CMOS Schmitt-trigger circuit for connection between a reference terminal and a power supply terminal and having an input terminal, comprising:
   a first CMOS inverter operatively connected to said input terminal, comprising a p-channel transistor and a n-channel transistor having an on state resistance,
   a second CMOS inverter connected in cascade to said first CMOS inverter,
   a third CMOS inverter connected in cascade to said second CMOS inverter comprising a p-channel transistor and a n-channel transistor,
   a feedback resistance connected between the output end of said third CMOS inverter and the input end of said second CMOS inverter having a resistance greater than said on state resistance of said n-channel transistor of said first CMOS inverter, and
   an output terminal connected to the output end of said second inverter for providing an output potential.

2. A CMOS Schmitt-trigger circuit for connection between a reference terminal and a power supply terminal and having an input terminal, comprising:
   a first CMOS inverter operatively connected to said input terminal, comprising a p-channel transistor and an n-channel transistor having an on state resistance,
   a second CMOS inverter connected in cascade to said first CMOS inverter,
   a third CMOS inverter connected in cascade to said second CMOS inverter comprising a p-channel transistor and a n-channel transistor,
   a feedback resistance connected between the output end of said third CMOS inverter and the input end of said second CMOS inverter having a resistance greater than said on state resistance of said n-channel transistor of said first CMOS inverter, and
   an output terminal connected to the output end of said second inverter for providing an output potential;
   said input terminal receiving an input potential having voltage values reaching both a lower and an upper threshold voltage of the circuit, the difference between said lower and said upper threshold voltages being a predetermined Schmitt width, said output potential varying in response to said input potential, the output end of said first CMOS inverter electrically connected to the input end of said second CMOS inverter, the output end of said second CMOS inverter electrically connected to the input end of said third CMOS inverter, and the output end of said third CMOS inverter electrically connected to the input end of said second CMOS inverter at least when said output potential varies in response to said input potential.

3. A CMOS Schmitt-trigger circuit as claimed in claim 1 or 2, wherein said feedback resistance is independent of the voltage at said power supply terminal.

4. A CMOS Schmitt-trigger circuit as claimed in claim 1 or 2, wherein said feedback resistance is comprised of a p-channel MOS transistor and an n-channel MOS transistor connected in parallel, each respective gate of said MOS transistors being connected to a respective one of said power supply terminal and said reference terminal.

5. A Schmitt-trigger circuit, comprising:
   an input terminal;
   a first inverter comprising at least one transistor, having an on state resistance, and an input and an output, said input thereof being connected to said input terminal;
   a second inverter comprising an input and an output, said input of said second inverter being operatively connected to said output of said first inverter;
   a third inverter comprising at least one transistor, having an on state resistance, and an input and an output, said input of said third inverter being operatively connected to said output of said second inverter;
   a feedback resistor, operatively connected between said output of said third inverter and said input of said second inverter having a resistance greater than said on state resistance of said transistor of said first inverter, and greater than said on state resistance of said transistor of said third inverter; and
   an output terminal, operatively connected to said output of said second inverter for providing an output potential.

6. A Schmitt-trigger circuit, comprising:
   an input terminal;
   a first inverter comprising at least one transistor, having an on state resistance, and an input and an output, said input thereof being connected to said input terminal;
   a second inverter comprising an input and an output, said input of said second inverter being operatively connected to said output of said first inverter;
   a third inverter comprising at least one transistor, having an on state resistance, and an input and an output, said input of said third inverter being operatively connected to said output of said second inverter;
   a feedback resistor, operatively connected between said output of said third inverter and said input of said second inverter having a resistance greater than said on state resistance of said transistor of said first inverter, and greater than said on state resistance of said transistor of said third inverter; and
   an output terminal, operatively connected to said output of said second inverter for providing an output potential;
   said input terminal receiving an input potential having voltage values reaching both a lower and an upper threshold voltage of the circuit, the difference between said lower and upper threshold voltages being a predetermined Schmitt width, said output potential varying in response to said input potential;
   the output end of said first inverter electrically connected to the input end of said second inverter, the output end of said second inverter electrically connected to the input end of said third inverter, and the output end of said third inverter electrically connected to the input end of said second inverter at least when said output potential varies in response to said input potential.

7. The circuit of claim 5 or 6, wherein said respective inverters comprise CMOS devices.

8. The circuit of claim 7, further comprising means for receiving power supply and ground voltages, and wherein each of said inverters comprises:
- first and second MOS transistors connected in series between the power supply voltage and the ground voltage, said first and second transistors each respectively comprising a gate;
- said input of said respective inverter being connected to both of said respective gates of said first and second MOS transistors;
- said output of said respective inverter being connected between said first and second transistors; and
- wherein said first and second transistors are of mutually opposite conduction types.

9. A schmitt-trigger circuit, comprising:
- an input terminal;
- a first inverter comprising at least one transistor, having an on state resistance, and an input and an output, said input thereof being connected to said input terminal;
- a second inverter comprising an input and an output, said input of said second inverter being operatively connected to said output of said first inverter;
- a third inverter comprising at least one transistor, having an on state resistance, and an input and an output, said input of said third inverter being operatively connected to said output of said second inverter;
- a resistance element, operatively connected between said output of said third inverter and said input of said second inverter having a resistance greater than said on state resistance of said transistor of said first inverter, and greater than said on state resistance of said transistor of said third inverter; and
- an output terminal, operatively connected to said output of said second inverter for providing an output potential.

10. A schmitt-trigger circuit, comprising:
- an input terminal;
- a first inverter comprising at least one transistor, having an on state resistance, and an input and an output, said input thereof being connected to said input terminal;
- a second inverter comprising an input and an output, said input of said second inverter being operatively connected to said output of said first inverter;
- a third inverter comprising at least one transistor, having an on state resistance, and an input and an output, said input of said third inverter being operatively connected to said output of said second inverter;
- a resistance element, operatively connected between said output of said third inverter and said input of said second inverter having a resistance greater than said on state resistance of said transistor of said first inverter, and greater than said on state resistance of said transistor of said third inverter; and
- an output terminal, operatively connected to said output of said second inverter for providing an output potential;
- said input terminal receiving an input potential having voltage values reaching both a lower and an upper threshold voltage of the circuit, the difference between said lower and upper threshold voltages being a predetermined Schmitt width, said output potential varying in response to said input potential;
- the output end of said first inverter electrically connected to the input end of said second inverter, the output end of said second inverter electrically connected to the input end of said third inverter, and the output end of said third inverter electrically connected to the input end of said second inverter at least when said output potential varies in response to said input potential.

11. The circuit of claim 9 or 10, further comprising means for receiving a power supply voltage and a ground voltage, and wherein said resistance element further comprises an active component controlled by the power supply voltage.

12. The circuit of claim 11, wherein said resistance element comprises first and second MOS transistors connected in parallel between said output of said third inverter and said input of said second inverter, said first and second transistors being of complementary conduction types.

13. The circuit of claim 12, wherein said first MOS transistor is a p-channel transistor and further comprises a gate connected to the ground voltage, and wherein said second MOS transistor is a n-channel transistor and further comprises a gate connected to the power supply voltage.

14. The circuit of claim 13, wherein each of said inverters respectively comprises:
- third and fourth MOS transistors connected in series between the power supply voltage and the ground voltage, said third and fourth transistors each respectively also comprising a gate;
- said input of said respective inverter being connected to both said respective gates of said third and fourth MOS transistors;
- said output of said respective inverter being provided from a connection point between said third and fourth transistors; and
- wherein said third and fourth transistors are of mutually opposite conduction types.

* * * * *